United States Patent [19]

Takahashi

[11] Patent Number: 5,331,572
[45] Date of Patent: Jul. 19, 1994

[54] INTEGRATED CIRCUIT AND LAYOUT SYSTEM THEREFOR

[75] Inventor: Naoya Takahashi, Tokyo, Japan

[73] Assignee: NEC Corporation, Tokyo, Japan

[21] Appl. No.: 871,287

[22] Filed: Apr. 20, 1992

[30] Foreign Application Priority Data

Apr. 26, 1991 [JP] Japan ................... 3-125567

[51] Int. Cl.$^5$ ............................................. G06F 15/60
[52] U.S. Cl. ..................................... 364/491; 364/488
[58] Field of Search ................ 364/488, 489, 490, 491

[56] References Cited

U.S. PATENT DOCUMENTS

| | | | |
|---|---|---|---|
| 3,629,843 | 12/1971 | Scheinman | 340/172.5 |
| 3,644,937 | 2/1972 | Isett | 444/1 |
| 4,910,680 | 3/1990 | Hiwatashi | 364/491 |
| 4,918,614 | 4/1990 | Modarres et al. | 364/490 |
| 4,942,317 | 7/1990 | Tanaka et al. | 307/465 |
| 5,124,273 | 6/1992 | Minami | 437/51 |
| 5,164,907 | 11/1992 | Yabe | 364/491 |

OTHER PUBLICATIONS

Deborah C. Wang, "Pad Placement and Ring Routing for Custom Layout", 27th ACM/IEEE Design Automation Conference, pp. 193-199, 1990.

Primary Examiner—Thomas G. Black
Assistant Examiner—Susan Wieland
Attorney, Agent, or Firm—Whitham, Curtis & Whitham; 10

[57] ABSTRACT

In the chip layout of an LSI, a layout near bonding pads is efficiently optimized. Especially in a chip having a large number of pins, an increase in chip size caused by pad necks can be prevented. Normal functional macro-blocks are arranged in an inner region of the LSI. On the other hand, input/output blocks including corner blocks are arranged at the peripheral portion of the LSI. In addition, pads separated from the input/output blocks are arranged on the LSI including portions near the corner blocks, and the input/output blocks and the pads are connected to each other through wiring lines.

11 Claims, 15 Drawing Sheets

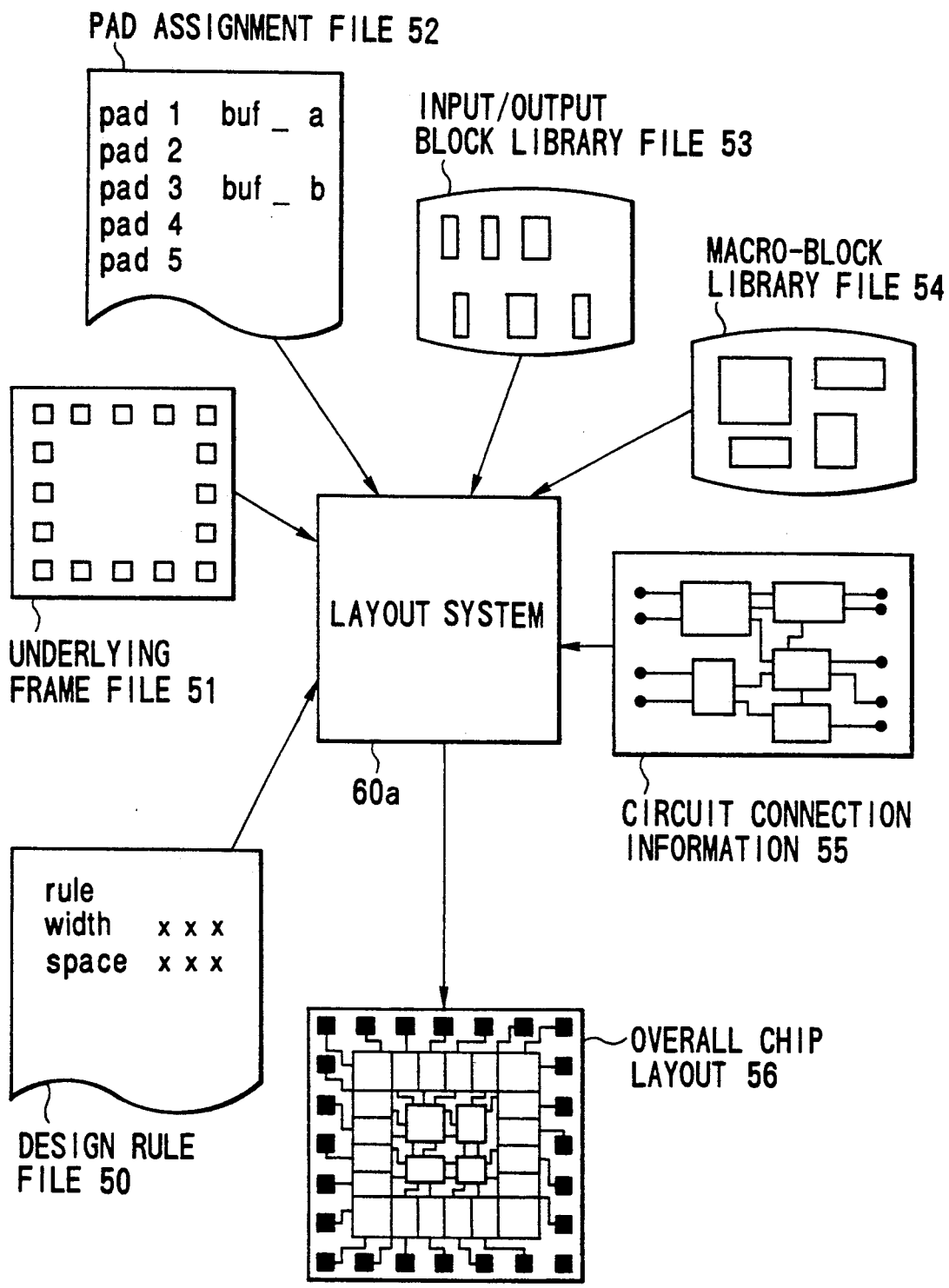
F I G. 3

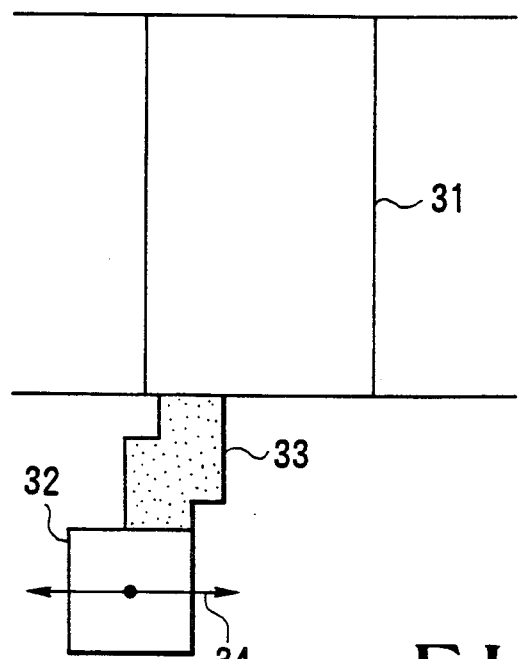
F I G. 13
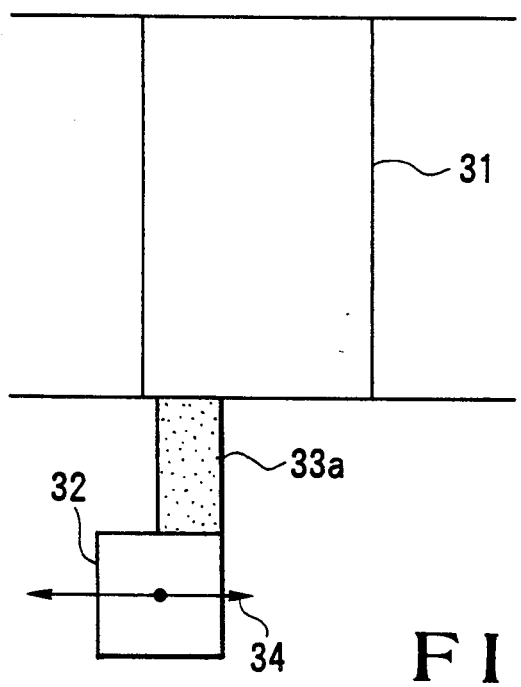
F I G. 14

INTEGRATED CIRCUIT AND LAYOUT SYSTEM THEREFOR

BACKGROUND OF THE INVENTION

The present invention relates to an integrated circuit and a layout method of a chip peripheral port on used in a layout system for supporting the design of the integrated circuit, more particularly, used for realizing the input/output function of an LSI (Large-Scale Integrated circuit).

FIG. 15 is a block diagram showing a main part of a layout system for a conventional integrated circuit.

A conventional layout system 60 includes an input/output block arranging means 61 for arranging input/output blocks at the peripheral portion of a chip, a macro-block arranging means 62 for arranging functional macro-blocks (to be referred to as macro-blocks hereinafter) in the inner region of the chip, and an inter-wiring means 65 for performing wiring between the macro-blocks and between the macro-blocks and the input/output blocks.

In an operation of the conventional layout system 60, as shown in FIG. 16, input/output block arranging processing is performed (step S31), macro-block arranging processing is performed (step S32), and finally, wiring processing between the macro-blocks and between the macro-blocks and the input/output blocks (step S33).

As described above, in an actual chip having the above layout, as shown in FIG. 17, macro-blocks 35 are arranged in the inner region of a semiconductor chip 1 (to be referred to as a chip hereinafter), input/output blocks 36 are arranged on each side of the chip peripheral portion, and corner blocks 37 serving as the input/output blocks are arranged at the four corners of the chip. In this case, each of the input/output blocks 36, as shown in FIG. 18, includes an input/output buffer (to be referred to as a buffer hereinafter) 38 and a bonding pad (to be referred to as a pad hereinafter) 39 connected to the buffer 38, and the buffer 38 includes power supply wiring patterns 40. As shown in FIG. 19, each of the corner blocks 37 includes power supply wiring patterns 41 for connecting the power supply wiring patterns 40 of the input/output blocks 36 positioned at both the sides of the corner block 37.

As shown in FIG. 20, the pad 39 included in each of the input/output blocks 36 must be arranged at a predetermined position so as to be connected to a lead frame 43 and a bonding line 42 when a chip of an LSI is assembled, and each of the input/output blocks 36 must be arranged at a position such that the pad 39 is kept at the predetermined position. Therefore, when a chip has a large number of pads, unless the input/output blocks 36 each have a sufficiently small width are equipped, the input/output blocks cannot be arranged to satisfy the above limitation. In addition, since the corner blocks 37 are arranged at the corner portions of the chip, the normal input/output blocks 36, i.e., the pads 39, cannot be arranged. For this reason, the regions of the corner portions cannot be effectively utilized.

As described above, in each chip of an LSI laid out by a conventional layout system, especially in the peripheral portion of the chip, there are large waste regions such as intervals between input/output blocks and unused regions of the corner portions. Especially in a chip having a large number of pads, regions for positioning pads are short.

SUMMARY OF THE INVENTION

It is an object of the present invention to provide an integrated circuit capable of effectively utilizing the region of a semiconductor chip peripheral portion and a layout system for the integrated circuit.

It is another object of the present invention to provide an integrated circuit capable of decreasing the area of a semiconductor chip and a layout system for the integrated circuit.

In order to achieve the above object, according to an aspect of the present invention, there is provided an integrated circuit comprising a plurality of macro-blocks arranged in an inner region of a semiconductor chip, a plurality of input/output blocks arranged at a peripheral portion of the functional macro-blocks, bonding pads respectively arranged between the input/output blocks and an outer frame of the semiconductor chip, a first layout obtained by performing predetermined wiring between the macro-blocks and between the macro-blocks and the input/output blocks, and a second layout obtained by performing wiring between the input/output blocks and the corresponding bonding pads.

In order to achieve the above objects, according to another aspect of the present invention, there is provided a layout system for an integrated circuit, comprising input/output block arranging means for initially arranging a plurality of input/output blocks at a peripheral portion of a semiconductor chip, separating bonding pads from the input/output blocks, and arranging the separated bonding pads between the input/output blocks and an outer frame of the semiconductor chip, functional macro-block arranging means for arranging a plurality of functional macro-blocks in an inner region of the semiconductor chip, interwiring means for performing wiring between the bonding pads and the corresponding input/output blocks, and interwiring means for performing predetermined wiring between the functional macro-blocks and between the functional macro-blocks and the input/output blocks.

BRIEF DESCRIPTION OF THE DRAWINGS

FIG. 3 is a view for explaining an input/output environment of the layout system in FIG. 2;

FIG. 13 is a layout view showing a wiring improving processing of the layout system in detail;

FIG. 14 is a layout view showing a wiring improving processing of the layout system in detail;

DESCRIPTION OF THE PREFERRED EMBODIMENT

An embodiment of the present invention will be described below with reference to the accompanying drawings.

Figure 1A:
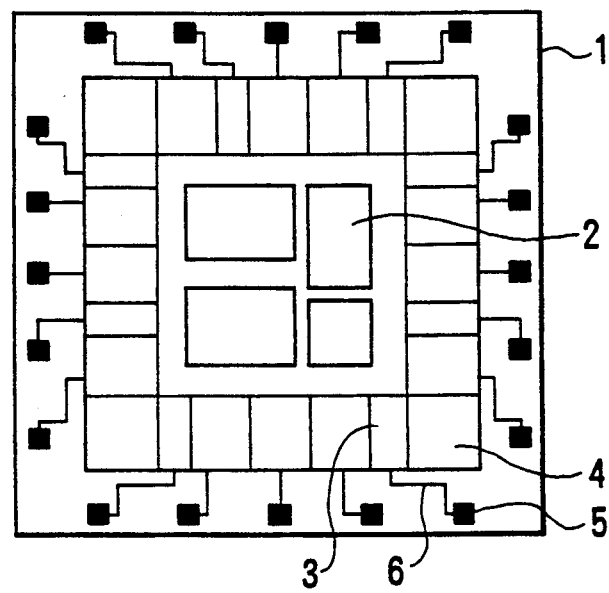
FIGS. 1A and 1B are layout views showing an integrated circuit according to an embodiment of the present invention.
Figure 1B:
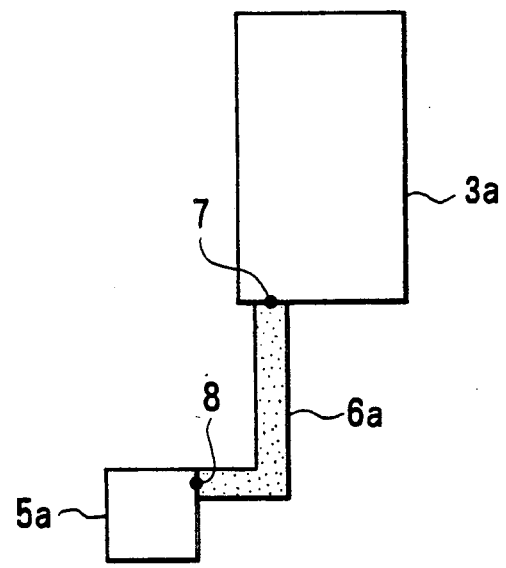

FIGS. 1A and 1B show a layout of an LSI according to an embodiment of the present invention. Note that FIG. 1B shows an enlarged portion of FIG. 1A.

An LSI according to this embodiment has a layout comprising macro-blocks 2 arranged in the inner region of a chip 1 and input/output blocks 3 including corner blocks 4 arranged around the macro-blocks 2. According to the characteristic features of the present invention, the integrated circuit comprises a layout including pads 5 arranged between the input/output blocks 3, the corner blocks 4, and the outer frame of the chip, e.g., on the outer frame of the chip, and wiring lines 6a for connecting terminals 8 of the pads 5a to terminals 7 of the input/output blocks 3a, wherein input/output blocks 3a have no pad.

Figure 2:
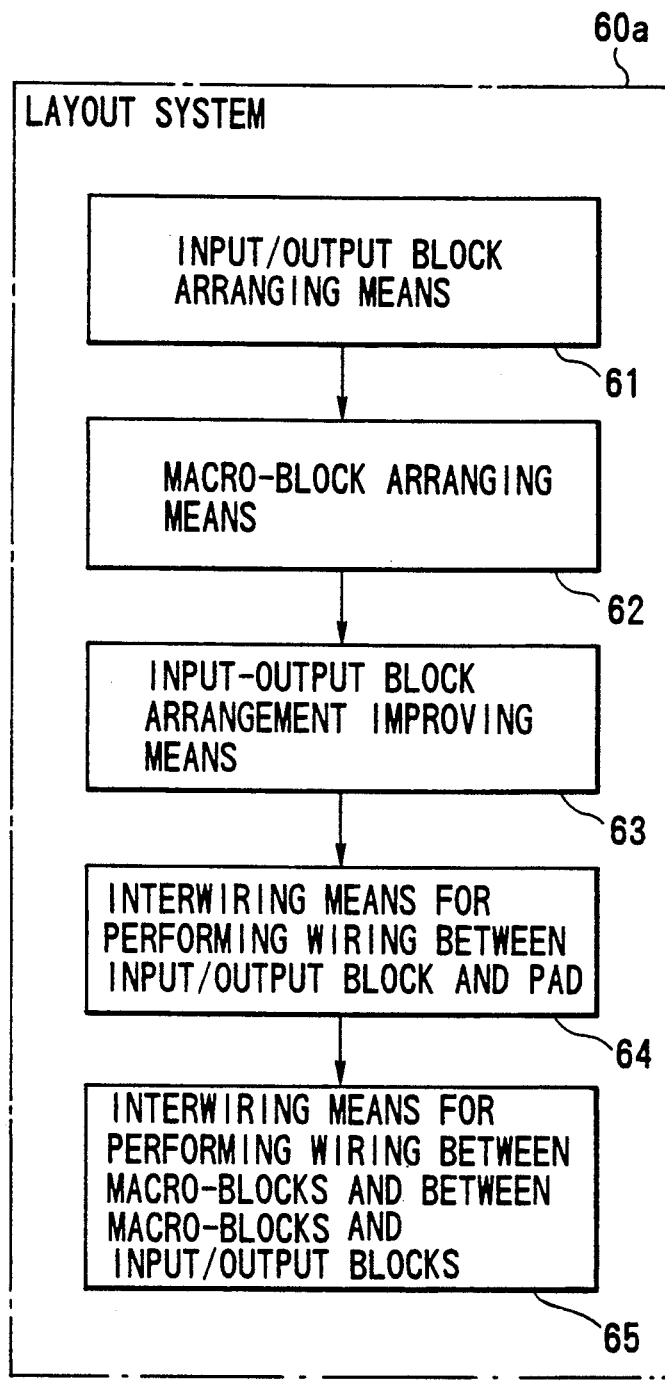
FIG. 2 is a block diagram showing a main part of a layout system according to an embodiment of the present invention.

FIG. 2 shows a main part of a layout system of an integrated circuit according to an embodiment of the present invention, and FIG. 3 shows an input/output environment of the layout system.

As shown in FIG. 3, according to this embodiment, a layout system 60a receives data from a design rule file 50, a underlying frame file 51, a pad assignment file 52, an input/output block library file 53, a macro-block library file 54, and circuit connection information 55, performs layout, and outputs an overall chip layout 56.

As shown in FIG. 2, a layout system according to this embodiment is a layout system 60a for an integrated circuit, comprising an input/output block arranging means 61 for arranging input/output blocks including corner blocks at the peripheral portion of a chip, a macro-block arranging means 62 for arranging macro-blocks in the inner region of the chip, and an interwiring means 65 for performing wiring between the macro-blocks and between the macro-blocks and the input/output blocks. According to the characteristic features of the present invention, the input/output block arranging means 61 includes a means for separating the input/output blocks from pads and arranging the separated pads between the input/output blocks and the outer frame of the chip and comprises an input/output block arrangement improving means 63 for improving the arrangement of the arranged input/output blocks on the basis of the connection relationship between the input/output blocks and the macro-blocks and an interwiring means 64 for performing wiring between the arranged bonding pads and the corresponding input/output blocks.

Figure 4:
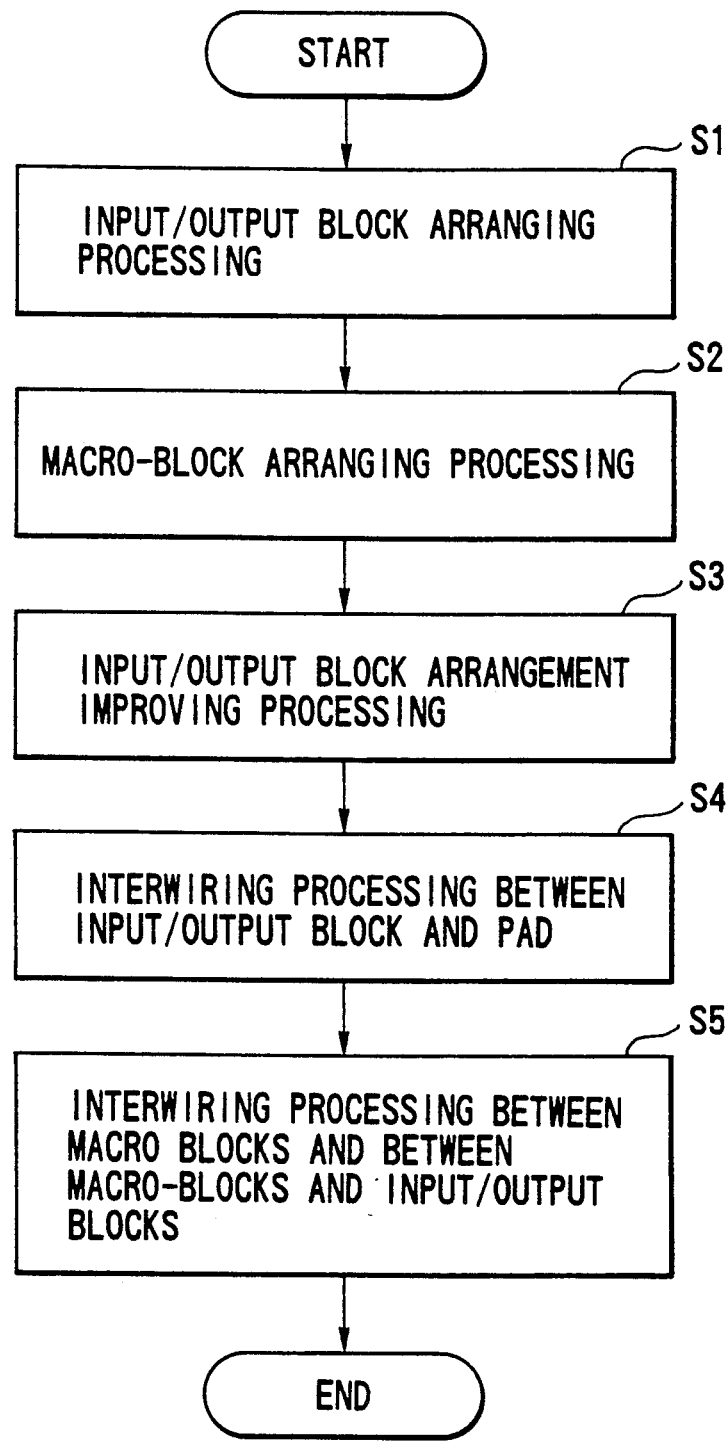
FIG. 4 is a flow chart showing an overall operation of the layout system.
Figure 5:
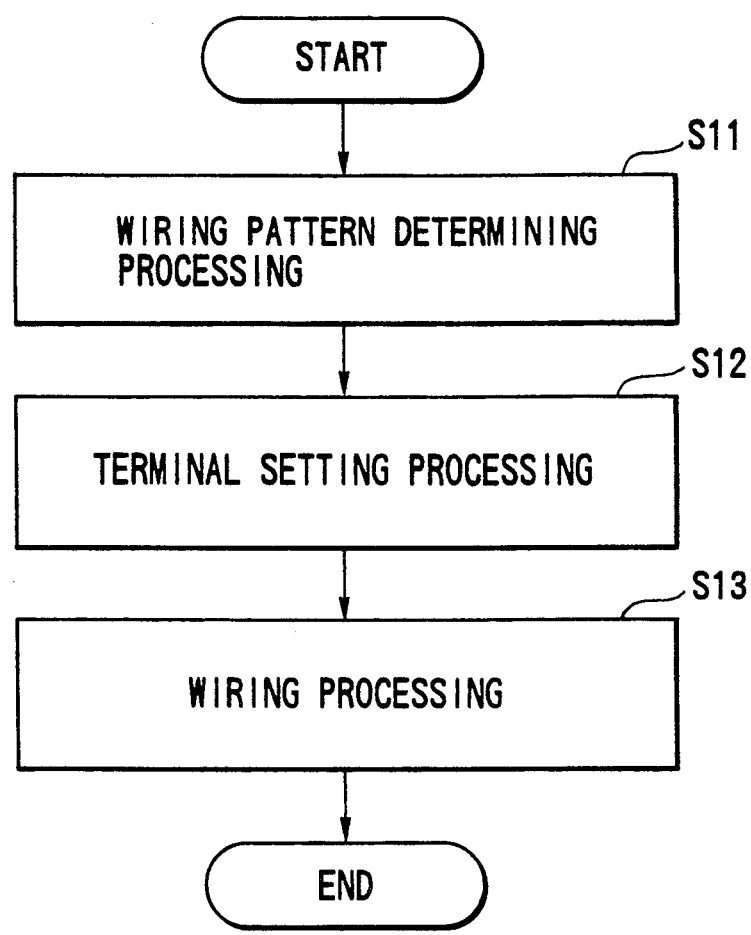
FIG. 5 is a flow chart showing interwiring processing between an input/output block and a pad by the layout system.

An operation of the layout system according to this embodiment will be described below with reference to FIGS. 3 to 10. FIG. 4 shows an overall operation of the layout system, FIG. 5 shows interwiring processing between an input/output block and a pad, and FIGS. 6 to 10 show processing operations in detail.

Figure 6:
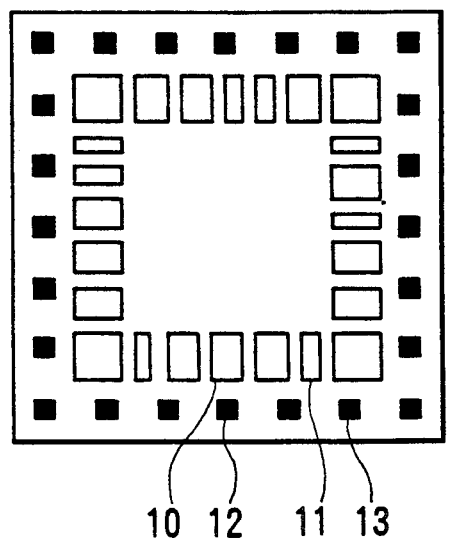
FIG. 6 is a layout view showing input/output block arranging processing of the layout system in detail.

In FIG. 4, an input/output block arranging processing of step S1, as shown in the input/output environment of FIG. 3, the underlying frame file 51 in which pad coordinates are described within a frame having a predetermined size, the pad assignment file 52 for assigning an input/output block to be designated to a specific pad, the input/output block library file 53, and the circuit connecting information 55 are loaded, and the input/output blocks are initially arranged. FIG. 6 shows a layout after the input/output blocks are arranged. Since specific input/output blocks 10 and 11 are designated to be respectively connected to pads 12 and 13 arranged on the outer frame of the chip 1 by the pad assignment file 52, the input/output blocks 10 and 11 are arranged at positions near the pads 12 and 13. Since other input/output blocks are not especially designated, the input/output blocks are arranged at positions corresponding to the remaining pads arranged on the outer frame of the chip 1.

Figure 7:
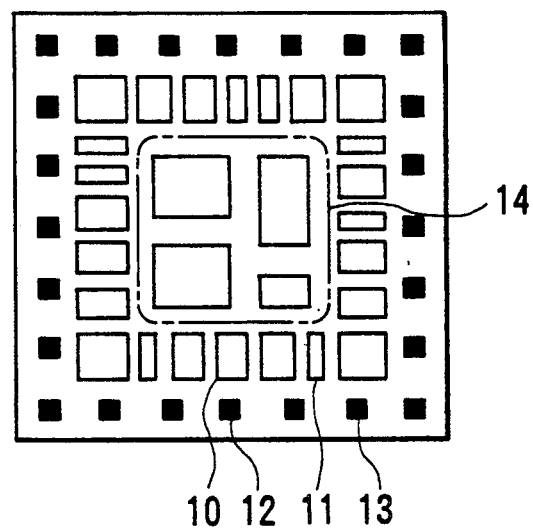
FIG. 7 is a layout view showing macro-block arranging processing of the layout system in detail.

In macro-block arranging processing of step S2, macro-blocks are arranged in a frame surrounded by the input/output blocks with reference to the macro-block library file 54. At this time, the arrangement positions of the macro-blocks are determined such that macro-blocks having a strong connection relationship are close to each other. FIG. 7 shows a layout after the macro-blocks are arranged, and the macro-blocks are arranged in a frame 14.

Figure 8:
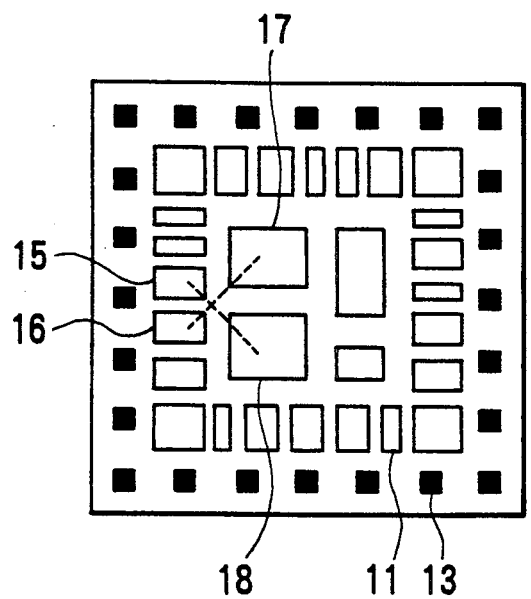
FIG. 8 is a layout view showing input/output block arrangement improving processing of the layout system in detail.

In input/output arrangement improving processing of step S3, the arrangement of the input/output blocks which have been initially arranged is improved with reference to connection relationships between the input/output blocks and the macro-blocks. FIG. 8 shows the arrangement improving processing. Since input/output blocks 15 and 16 have connection relationships with macro-blocks 18 and 17, respectively, the two input/output blocks 15 and 16 are replaced with each other, thereby improving the arrangement of the input/output blocks 15 and 16. At this time, the arrangement coordinates of the input/output blocks are determined, and simultaneously, the relationships between the input/output blocks and the pads are determined.

Figure 9:
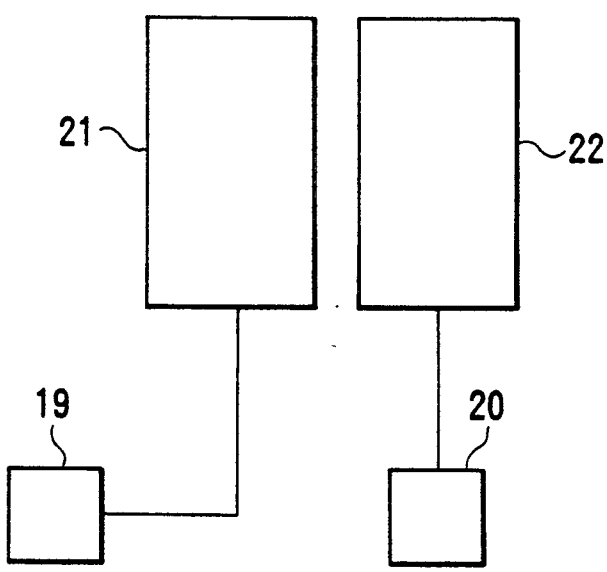
FIG. 9 is a layout view showing wiring processing of the layout system.

In interwiring processing between an input/output block and a pad in step S4, a wiring line for connecting an input/output block to a pad corresponding to the input/output block is formed. FIG. 5 shows this wiring processing in detail. In wiring pattern determining processing of step S11, the shape of the wiring line and the drawing direction of the wiring line are determined by a positional relationship between the input/output blocks and the pads. FIG. 9 shows this determining processing. In FIG. 9, a wiring pattern is selected as follows. That is, since a pad 19 is positioned on the left side of a corresponding input/output block 21, the wiring pattern is drawn from the right direction of the pad 19, and the wiring pattern is bent in the upper direction and reaches the input/output block 21. In addition, since a pad 20 is positioned parallel to an input/output block 22, a pattern which is vertically drawn from the upper direction of the pad 20 and reaches the input/output block 22 is selected.

Figure 10:
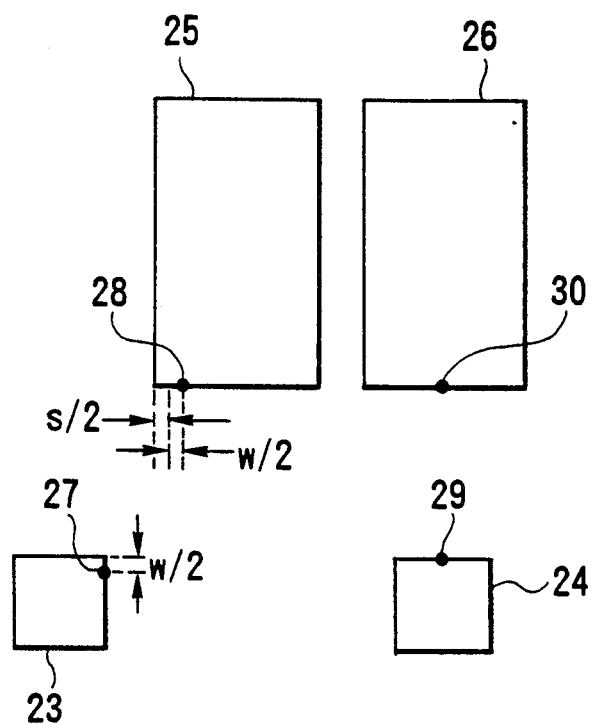
FIG. 10 is a layout view showing terminal setting processing of the layout system.

In terminal setting processing of step S12, terminals are set at wiring line drawing sides of the input/output blocks and the pads determined in step S11. At this time, design rules such as the width of a wiring line and a minimum wiring line interval are loaded from the design rule file 50. FIG. 10 shows a layout showing this processing. In FIG. 10, a pad 23 and an input/output block are not positioned on the same X-coordinate axis. Since a wiring line is drawn from the right side of the pad 23, a terminal 27 is set at a position lower than the upper right corner of the pad 23 by a half of a wiring width w/2. In an input/output block 25, a terminal 28 is set at a position shifted from the lower left corner of the block 25 to the right direction by a half of the (wiring width w)+(minimum interwiring interval s). The lower left corner of the block 25 is the closest to the pad 23. On the other hand, since a pad 24 and an input/output block 26 are positioned on the same X-coordinate axis, terminals 29 and 30 are set at the same X-coordinate positions on the upper side of the pad 24 and the lower side of the input/output block 26, respectively. Thereafter, a wiring line for connecting the terminals set in the wiring process of step S13 is generated. At this time, if a wiring region is short, only the input/output blocks are moved, the pads are fixed to the positions initially given by the underlying frame file 51. FIG. 1A shows a layout after the wiring processing is finished. In FIG. 1A, the input/output block 3 is connected to the pad 5 near the corner block 4. FIG. 1B describes a specific input/output block 3a and a specific pad 5a. In FIG. 1B, the terminals 7 and 8 which are preset in terminal setting processing are connected to each other by a wiring line 6a.

In interwiring processing between the macro-blocks and between the macro-blocks and input/output blocks in step S5, interwiring processing between the macro-blocks and between the macro-blocks and the input/output blocks is performed as in a conventional layout system. At this time, the wiring line is generated such that the positions of the input/output blocks are fixed not to be moved. As described above, the final chip overall layout 56 shown in FIG. 3 is obtained.

In the description of the above embodiment, once the pad positions are determined, they cannot be shifted. However, if the pad positions can be changed in relation to the input/output blocks to some extent, systematic wiring processing can be performed. A case wherein an interwiring means for performing wiring between input/output block and pads includes a means for performing the systematic wiring processing will be described below.

Figure 11:
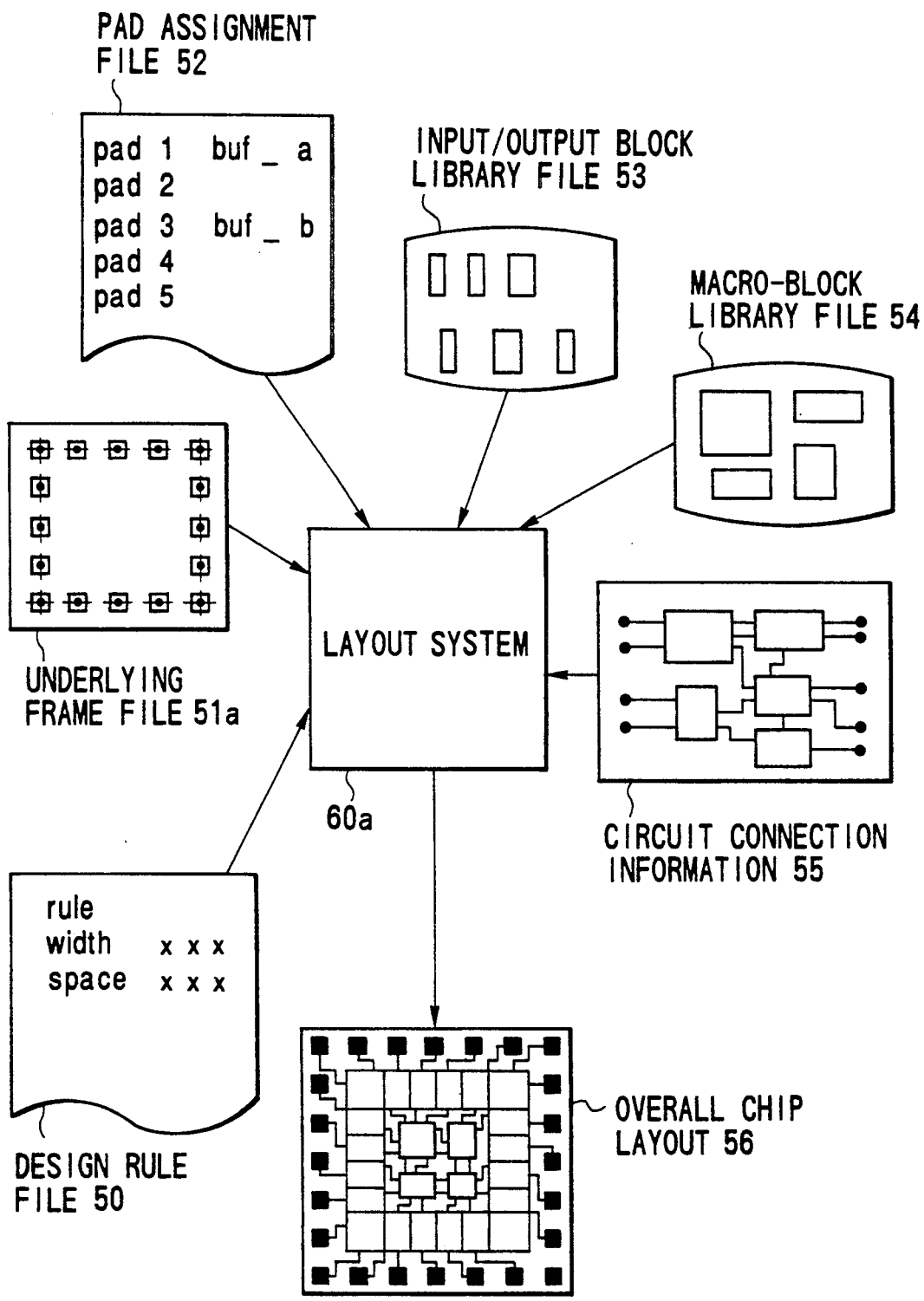
FIG. 11 is a view for explaining another input environment of the layout system according to an embodiment of the present invention.
Figure 12:
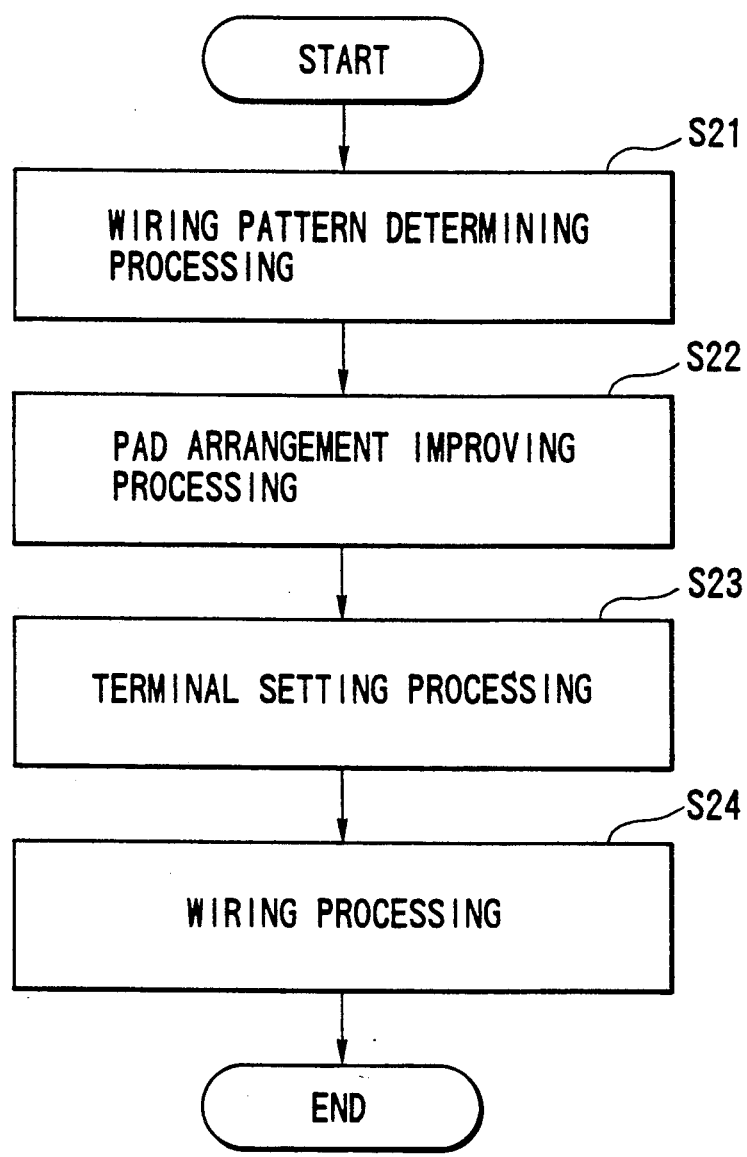
FIG. 12 is a flow chart showing wiring processing between an input block and a pad.
Figure 15:
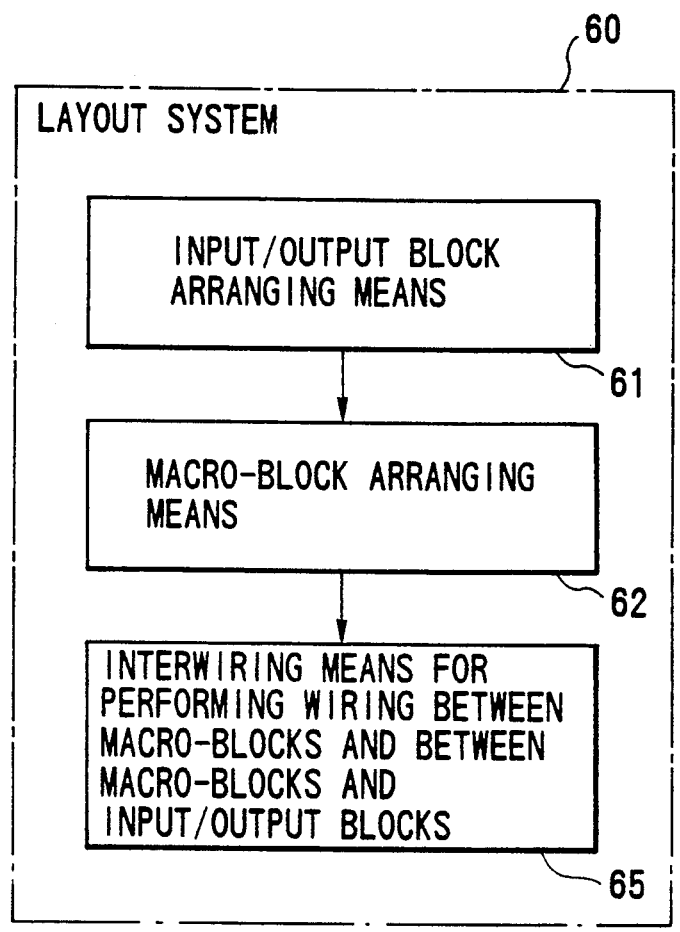
FIG. 15 is a block diagram showing a main part of a conventional layout system.
Figure 16:
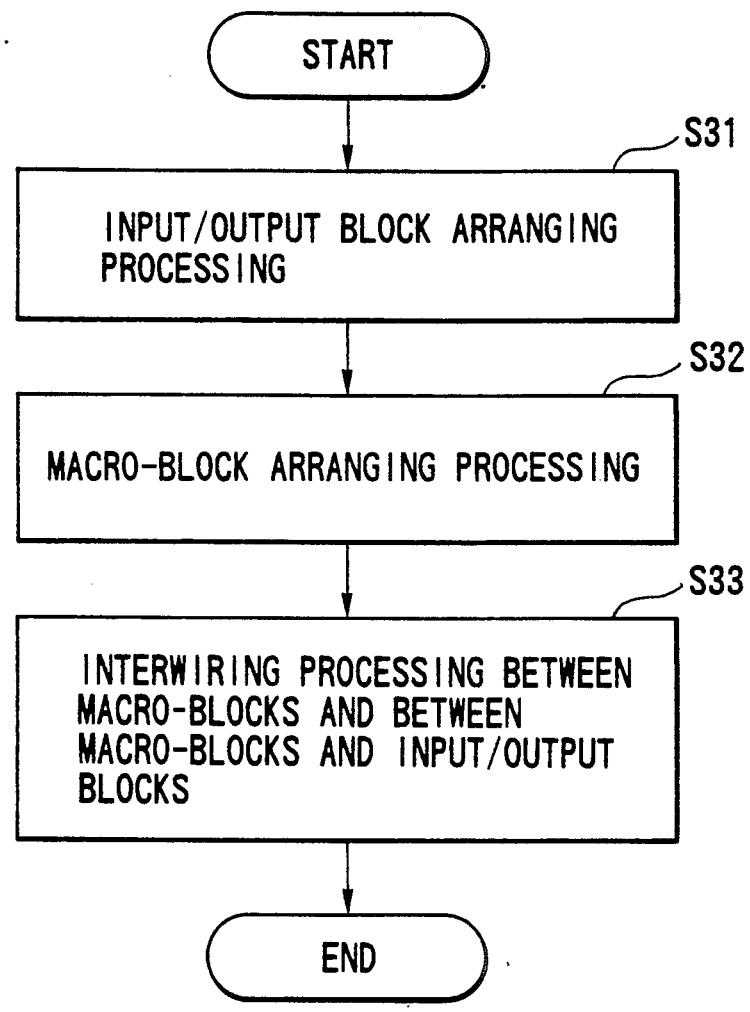
FIG. 16 is a flow chart showing an operation of the layout system shown in FIG. 15.
Figure 17:
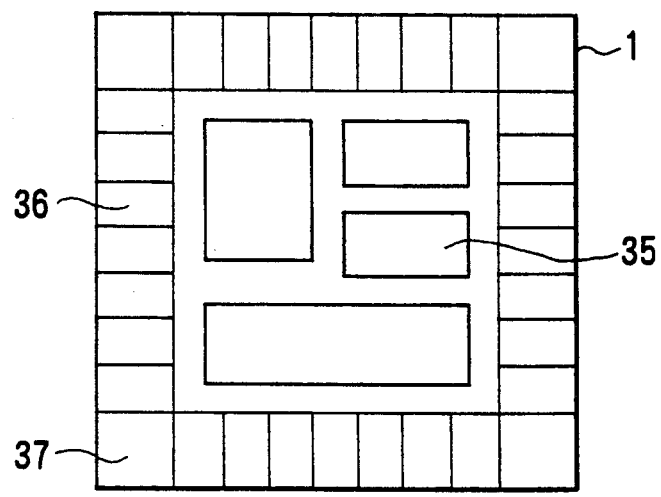
FIG. 17 is a layout view showing a conventional integrated circuit.
Figure 18:
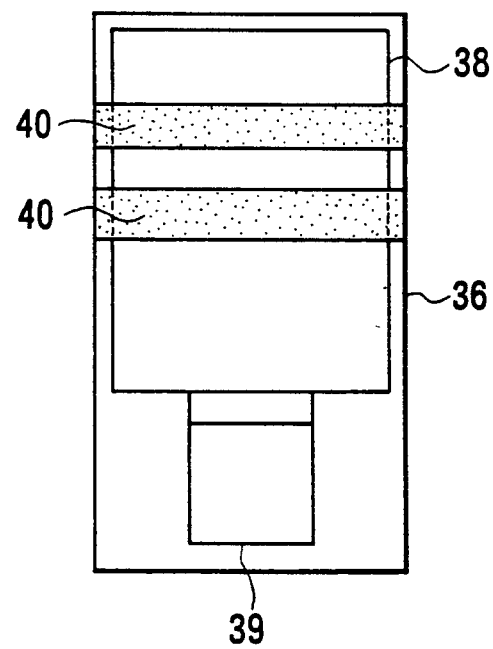
FIG. 18 is a layout view showing an input/output block of the integrated circuit in FIG. 17.
Figure 19:
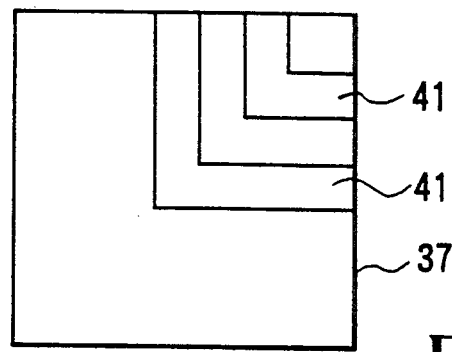
FIG. 19 is a layout view showing a corner block of the integrated circuit in FIG. 17.
Figure 20:
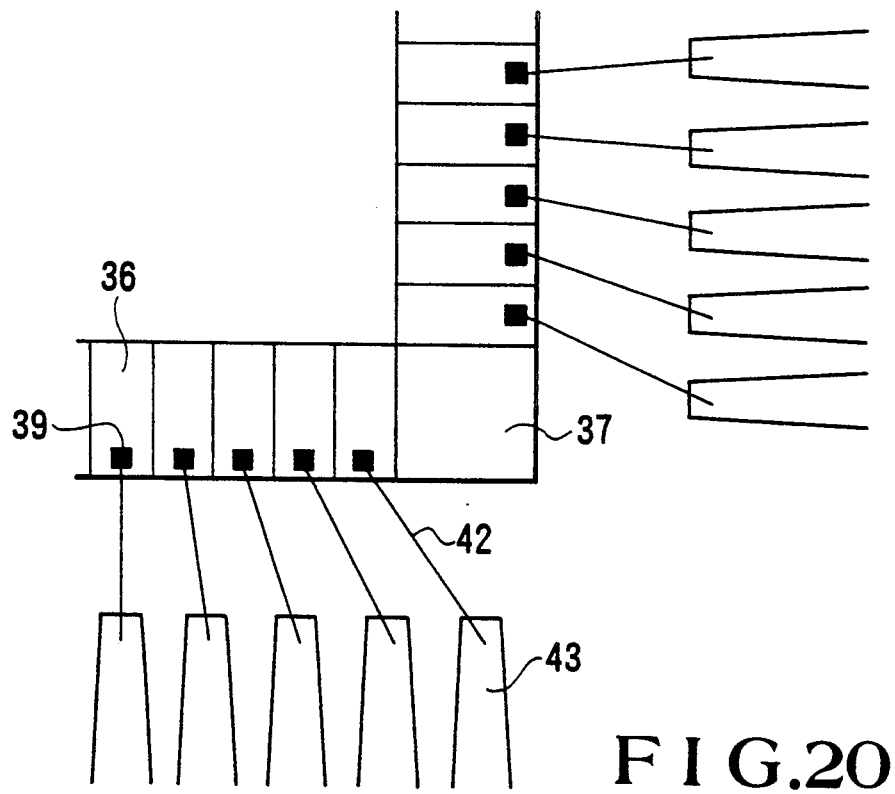
FIG. 20 is a layout view for explaining a state wherein a chip is assembled.

FIG. 11 shows an input/output environment of a system including the above means, and FIG. 12 shows an operation of the interwiring means for performing wiring between input/output blocks and pads. FIG. 12 is obtained by adding pad arrangement improving processing (step S22) to the flow chart of FIG. 5. The input/output environment of FIG. 11 is similar to that of FIG. 3 except for the content of an underlying frame file 51a. That is, arrangement coordinates of the pads in the underlying frame file 51a of FIG. 11 are different from that in the underlying frame file 51 of FIG. 3, and the coordinates of an initial arrangement and a movable range are stored in the underlying frame file 51a in relation to each pad.

FIG. 13 shows a positional relationship between an input/output block 31 and a pad 32. In FIG. 13, reference numeral 33 denotes a predicted wiring pattern represented by present arrangement coordinates, and reference numeral 34 denotes a movable range of the pad 32. In pad arrangement improving processing in step S22 of FIG. 12, when the bent wiring pattern 33 as shown in FIG. 13 is expected on the basis of a positional relationship between the pad and the input/output block in wiring pattern determination processing of step S21, the pad 32 is moved within the movable range 34. At this time, when the bent wiring pattern 33 can be changed into a linear wiring pattern 33a as shown in FIG. 14, processing for moving the pad 32 is performed. Therefore, the number of bent wiring patterns is decreased, and an increase in wiring area is prevented.

As has been described above, according to the method of the present invention, pads are separated from input/output blocks normally used in the layout of an LSI, and the input/output blocks and the pads are connected to each other with a wiring line. The input/output blocks can thus be arranged independently of the limitation of pad arrangement positions. Pads can be arranged near the corners of a chip. For this reason, the region of a peripheral chip portion can be effectively used, and a chip area can be advantageously decreased.

What is claimed is;

1. An integrated circuit comprising:
   a plurality of macro-blocks arranged in an inner region of a semiconductor chip;
   a plurality of input/output blocks arranged at a peripheral portion of said macro-blocks;
   bonding pads respectively arranged between said input/output blocks and an outer frame of said semiconductor chip;
   a first layout obtained by performing predetermined wiring between said macro-blocks and between said macro-blocks and said input/output blocks;
   a second layout obtained by performing wiring between said input/output blocks and said corresponding bonding pads,
   wherein said bonding pads are arranged near corners of said semiconductor chip, and said second layout has a bent wiring pattern between input/output blocks corresponding to said bonding pads arranged near the corners of said semiconductor chip,
   wherein said input/output blocks and said bonding pads corresponding to said input/output blocks respectively include terminals each having a wiring drawing position set on a basis of relationships between said input/output blocks and said bonding pads, and wherein said bonding pads are connected to said input/output blocks such that said terminals are connected to each other through wiring lines,
   a shape and a drawing direction of a wiring of said second layout being determined by a positional relationship between said input/output blocks and said bonding pads corresponding to said input/output blocks, said input/output blocks being arranged at positions near said bonding pads corresponding to said input/output blocks.

2. An integrated circuit according to claim 1, wherein said bonding pads are arranged on an outer frame of said semiconductor chip.

3. An integrated circuit according to claim 1, wherein said bonding pads arranged near the corners of said semiconductor chip are connected to said input/output blocks corresponding to said bonding pads through the wiring pattern of said second layout drawn in parallel to one side of said semiconductor chip on which said corresponding input/output blocks are arranged.

4. A layout system for an integrated circuit, comprising:
input/output block arranging means for initially arranging a plurality of input/output blocks at a peripheral portion of a semiconductor chip, separating bonding pads from said input/output blocks, and arranging the separated bonding pads between said input/output blocks and an outer frame of said semiconductor chip;
functional macro-block arranging means for arranging a plurality of functional macro-blocks in an inner region of said semiconductor chip;
interwiring means for performing wiring between said bonding pads and said corresponding input/output blocks; and
interwiring means for performing predetermined wiring between said functional macro-blocks and between said functional macro-blocks and said input/output blocks, wherein said interwiring means includes wiring pattern determining means for determining a wiring shape.

5. A system according to claim 4, wherein said wiring pattern determining means includes means for determining a wiring shape and a drawing direction on a basis of positional relationships between said input/output blocks and said bonding pads.

6. A layout system for an integrated circuit, comprising:
input/output block arranging means for initially arranging a plurality of input/output blocks at a peripheral portion of a semiconductor chip, separating bonding pads from said input/output blocks, and arranging the separated bonding pads between said input/output blocks and an outer frame of said semiconductor chip;
functional macro-block arranging means for arranging a plurality of functional macro-blocks in an inner region of said semiconductor chip;
interwiring means for performing wiring between said bonding pads and said corresponding input/output blocks; and
interwiring means for performing predetermined wiring between said functional macro-blocks and between said functional macro-blocks and said input/output blocks,
wherein said interwiring means for performing wiring between said input/output blocks and said bonding pads includes wiring pattern determining means for determining a wiring shape and a drawing direction on a basis of positional relationships between said input/output blocks and said bonding pads, terminal setting means for setting terminals on wiring line drawing sides determined by said wiring pattern setting means, and wiring means for forming wiring lines for connecting said terminals set by said terminal setting means.

7. A system according to claim 6, wherein said input/output block arranging means initially arranges said input/output blocks and said bonding pads on a basis of an underlying frame file in which pad coordinates are described within a frame having a predetermined size, a pad assignment file for designating an input/output block to be assigned to a specific pad, an input/output block library file, and circuit connecting information.

8. A system according to claim 6, further comprising input/output block arrangement improving means for improving an arrangement of said initially arranged input/output blocks in accordance with connection relationships between said input/output blocks and said functional marco-blocks.

9. A system according to claim 1, wherein, when a wiring region is short, only said input/output blocks are moved, and said bonding pads are fixed to initially arranged positions.

10. A system according to claim 6, further comprising bonding pad arrangement improving means for moving bonding pads within a predetermined movable range such that a bent wiring pattern is changed into a linear wiring pattern when the bent wiring pattern is determined by said wiring pattern setting means.

11. A system according to claim 10, wherein said bonding pads have a rectangular shape with a drawn side from which the wiring pattern of said second layout is drawn, said terminals of said bonding pads are set at positions further than end portions of the drawn sides thereof by a half of a wiring width, and said terminals of said input/output blocks are set at positions further than end portions of a side of said semiconductor chip, on which said input/output blocks are arranged, by half of a sum of the wiring width and a minimum interwiring interval.

* * * * *